United States Patent [19]

Nayler et al.

[11] Patent Number: 4,689,560

[45] Date of Patent: Aug. 25, 1987

[54] LOW R.F. DOSAGE MAGNETIC RESONANCE IMAGING OF HIGH VELOCITY FLOWS

[75] Inventors: Graham L. Nayler, Abingdon; Pradip M. Pattany, Willoughby, Ohio

[73] Assignee: Picker International, Inc., Highland Hts., Ohio

[21] Appl. No.: 798,750

[22] Filed: Nov. 15, 1985

Related U.S. Application Data

[63] Continuation-in-part of Ser. No. 766,757, Aug. 16, 1985, Pat. No. 4,683,431.

[51] Int. Cl.$^4$ ............................................. G01R 33/20
[52] U.S. Cl. ..................................... 324/306; 324/309
[58] Field of Search ............... 324/300, 306, 307, 309, 324/312, 313, 314

[56] References Cited

U.S. PATENT DOCUMENTS

| | | | |
|---|---|---|---|
| 4,165,479 | 8/1979 | Mansfield | 324/309 |
| 4,509,015 | 4/1985 | Ordidge et al. | 324/309 |
| 4,516,075 | 5/1985 | Moran | 324/309 |
| 4,516,582 | 5/1985 | Redington | 324/309 X |
| 4,520,828 | 6/1985 | Burl et al. | 128/653 |
| 4,523,596 | 6/1985 | Macovski | 128/653 |
| 4,528,985 | 7/1985 | Macovski | 128/653 |
| 4,532,473 | 7/1985 | Wherli | 324/306 |
| 4,551,680 | 11/1985 | Macovski | 324/309 |
| 4,570,119 | 2/1986 | Wehrli et al. | 324/306 |
| 4,574,239 | 4/1986 | Singer | 324/306 |
| 4,595,879 | 6/1986 | Lent et al. | 324/309 |
| 4,602,641 | 7/1986 | Feinberg | 128/653 |

FOREIGN PATENT DOCUMENTS

| | | |
|---|---|---|
| 0115642 | 8/1984 | European Pat. Off. |
| 0142343 | 5/1985 | European Pat. Off. |
| 0145276 | 6/1985 | European Pat. Off. |
| 2127155 | 4/1984 | United Kingdom |

OTHER PUBLICATIONS

"NMR Blood Flow Imaging Using Multiecho, Phase Contrast Sequences" by M. O'Donnell, Med. Phys., 12(1), Jan./Feb. 1985, pp. 59–64.

"A New Method of NMR Flowing Imaging" Letters to the Editor, Phys. Med. Biol., 1984, vol. 29, No. 7, pp. 891–835.

"Physics Abstracts", ISSN 0036-8091, Science Abstracts Series A, 2nd Jan. 1985, Abstracts 1–4906.

P. R. Moran, "A Flow Velocity Zeumatographic Interlace for NMR Imaging in Humans", Mag. Res. Imag., V.I, pp. 197–203 (1982).

D. J. Bryant et al, "Measurement of Flow with NMR Imaging Using A . . . Difference Technique", JCAT, 8(4):588–593 (1984).

(List continued on next page.)

*Primary Examiner*—Michael J. Tokar
*Attorney, Agent, or Firm*—Fay, Sharpe, Beall, Fagan, Minnich & McKee

[57] ABSTRACT

A main magnetic field coil (10) and control (12) cause a generally uniform main magnetic field through an image region. A resonance excitation control (22) causes an R.F. coil (20) to generate excitation pulses (100). A slice gradient control (32) and a read gradient control (34) cause a gradient coil (30) to generate complementary slice selection gradient profiles (112, 114) and complementary read gradient profiles (122, 124) in such a manner that the effective first moment in time is substantially zero. By time shifting a pulse in one or both of the slice selection and read gradient sequences (FIGS. 3 and 4), resonating nuclei in the selected slice can be phase encoded. A transform algorithm (40) transforms field echo signals (102) received by the R.F. coil into image representations. A first memory (54) receives real and imaginary portions of the image representations when the read and slice selection gradients are not shifted and a second memory (56) receives the image representations when one or both of the read and slice selection gradients are time shifted. A phase difference map (70) is calculated (60) from the arctangent of phase difference values derived from the first and second images. The intensity of each pixel of the phase difference map varies with phase shift, hence velocity.

19 Claims, 7 Drawing Figures

OTHER PUBLICATIONS

T. W. Redpath, et al., "A New Method of NMR Flow Imaging", Phys. Med. Biol., 29(7):891-898 (1984).

K. J. Packer, "The Study of Slow Coherent Molecular Motion by Pulsed NMR", Molecular Phys., 17(4):355-368 (1969).

V. Waluch et al, "NMR Even Echo Rephasing in Slow Laminar Flow", JCAT, 8(4):594-598 (1984).

W. G. Bradley et al., "Blood Flow: Magnetic Resonance Imaging", Radiology 154:443-450 (1985).

R. J. Hayward, et al., "Pulsed Field Gradient Spin Echo NMR Studies on Flow in Fluids," Molecular Phys., 23(6) 1083-1102 (1972).

LOW R.F. DOSAGE MAGNETIC RESONANCE IMAGING OF HIGH VELOCITY FLOWS

This application is a continuation-in-part of Application Ser. No. 766,757 filed Aug. 16, 1985, now U.S. Pat. No. 4,683,431.

BACKGROUND OF THE INVENTION

The present invention relates to the art of magnetic resonance imaging of moving substances and velocity determination by phase mapping. It finds particular application in conjunction with measuring blood flow and will be described with particular reference thereto. However, it is to be appreciated that the invention also applicable to imaging or phase mapping other anatomical tissue movement, non-biological fluid flows, multicomponent systems in which one gaseous, fluid, semi-fluid, solid, or other component moves relative to other components, or the like.

Heretofore, it has been recognized that the spin-echo magnetic resonance imaging signal from material flowing through a field gradient experiences a phase shift. Because the phase shift varies linearly with velocity, the spin-echo imaging and phase mapping have been used to measure velocities of slow moving, uniform flows, including blood flows in vivo. However, varying flow rates cause corresponding variations in the phase shift which interferes with the phase encoding. These phase variations result in noise which extends from the blood vessel across the image in the phase encoding direction. This is particularly serious at high flow velocities at which there are frequently small velocity variations and eddy currents which cause significant phase shifts. This renders the prior art techniques unsuited to phase mapping high blood flow velocities such as major blood flows adjacent the heart. High blood flow rates of clinical interest occur in the coronary, carotid, and pulmonary arteries and the aorta.

Several techniques have been devised for phase mapping slower, relatively constant blood flows. In one such technique, the gradients are velocity encoded. The pixel phases are calculated on one image obtained using the velocity encoded gradients. See P. R. Moran, "A flow Velocity Zeugmatographic Interlace for NMR Imaging in Humans," Magnetic Resonance Imaging, volume 1, pages 197–203, 1982. In another technique described in D. J. Bryant, J. A. Payne, D. N. Firmin, and D. B. Longmore, "Measurement of flow with NMR Imaging Using a Gradient Pulse and Phase Difference Technique", in the Journal of Computer Assisted Tomography, volume 8, number 4, pages 588–593, 1984, two images are obtained. One is obtained with a standard sequence and the other is obtained with velocity encoded gradients. The phase difference between the two is then mapped. In a technique of T. W. Redpath, D. G. Norris, R. A. Jones, and J. S. Hutchison, "A New Method of NMR Flow Imaging", Phys. Med. Biol. volume 24, number 7, pages 891–898, 1984, the velocity information is extracted pixel by pixel. Several images, each with one of a plurality of encoded gradients, are collected. A Fourier transform is performed on the pixel phases to extract the velocity information.

Two-echo Carr-Purcell sequences have also been used to map blood flows. However, the Carr-Purcell sequences make no determination of the flow velocity. The second echo of the Carr-Purcell sequence refocuses the flow related phase shift information. That is, the flow related phase shift acquired by the material flowing in the read gradient direction on the first echo is refocused on the second echo. This refocusing provides increased intraluminal signal intensity with even-echo rephasing. See K. J. Packer, "The study of Slow Coherent Molecular Motion by Pulsed Nuclear Magnetic Resonance", Molecular Physics, volume 17, number 4, pages 355–368, 1969 and V. Waluch and W. G. Bradley, "NMR Even Echo Rephasing in Slow Laminar Flow", Journal of Computer Assisted Tomography, volume 8, number 4, pages 594–598, 1984.

Conventional slice selection and frequency encoding both use spin or field gradient echoes. The phase shift at each pixel is dependent on the flow in both the read and the slice select direction. Although the relative phase shift at each pixel may be rendered sensitive to flow in only a single direction, the high sensitivity to flow velocity variations remains. Commonly, a phase shift of greater than 20 degrees for each centimeter per second of velocity change is experienced.

The velocity sensitivity has two adverse effects on the resultant image. First, magnetic resonance signals are phase dependent on the varying phase-encode field gradient. The two dimensional Fourier transform method of spatially mapping the magnetic resonance signals identifies signal components arising from different positions along the phase-encode gradient. As the gradient is incremented to collect a plurality of views, the signal arising from a given position changes in phase by an amount proportional to its position. Spatial resolution is improved by the Fourier transformation of the signals acquired over a plurality of views or increments of the phase encoded gradient, e.g. 256 views.

The phase dependence of the magnetic resonance signal on velocity introduces an extra term in the phase encoding process. When the velocity dependent phase term is constant from view to view, the extra term has no effect on the spatial resolution. However, when the velocity changes from view to view, such as from turbulence or minor irregularities in heart rate or ejection volume, the associated phase changes are interpreted as noise when decoding the spatial position of the resonance signal component. The available signal intensity is dispersed through the image in the phase encoding dimension or direction. This prevents signal phase, hence, velocity determination.

The second effect of the velocity sensitivity is a reduction in the signal intensity from vessels flowing in the read direction by phase cancellation through a flow profile. For example, laminar flow through a circular pipe lying within the selected slice has a flow profile which is parabolic. The maximum flow velocity is at the center of the pipe, while the flow velocity is zero at the boundary with the wall. When the pipe and the fluid flowing therein is imaged through a longitudinal slice, one resultant resonance signal represents the projection or integral of the signal components from columns of incremental volume elements extending across the pipe. The component from each incremental volume element has the same intensity but each has a phase which is proportional to the local velocity. Summing or projecting the phases in the column across the pipe sums components from incremental volume elements which have the generally parabolic range of velocities. This summation of signal components across the pipe leads to signal attenuation by phase cancellation. As the phase sensitivity to velocity increases, the phase cancellation becomes greater. In a spin-echo sequence that is imaging velocities in the read direction above 15 centimeters per second, attenuations of over 75% have been encountered. In actual measurement of blood flow, the attenuation is lower attributable to the non-Newtonian nature of blood. Blood travels through the body with a flow which approximates plug flow more closely than laminar flow.

Another disadvantage of spin-echo sequences for blood measurement arises from the use of a single 180 degree pulse within each cycle of the sequence. The 180 pulse generates the echo and refocuses the applied gradients as well as the static magnetic field inhomogeneity. If the refocusing pulse is slice selected, excited material flowing oblique to or perpendicular to the selected slice may move out of the selected slice in the time interval between application of the excitation and refocusing pulses. Hence, the excited material does not experience the refocusing pulse and severe signal loss is observed. However, this disadvantage may be overcome with broadband refocusing pulses which refocus excited material however it has moved since excitation.

However, broadband refocusing pulses introduce another problem in blood and other materials with relatively long relaxation times. Material outside the selected slice is subject to a series of the broadband refocusing pulses arising from repetition of the imaging sequence. This has the effect of inverting Z-magnetization at every repetition of the imaging sequence, typically at least every second. The inversion pulses then cause a progressive saturation of the material outside the slice until a semi-saturated steady state polarization is reached. When this material moves into the slice, it produces a signal proportional to this polarization. Partial saturation then produces a corresponding reduction in signal intensity. For example, when imaging blood with a 20 ms spin-echo sequence repeated every one second, the intensity is reduced approximatey 45% relative to fully polarized blood.

In the preferred embodiment described in the parent application, the imaging sequence utilized a pair of 180° inversion pulses. A first broadband 180° inversion pulse was applied followed by a 90° resonance excitation pulse, as well as first slice selection and read gradient sequences. A second broadband 180° inversion pulse was applied contemporaneously with the read and slice selection gradient sequences. The gradient sequences each included complementary opposite polarity gradient pulses which effectively zeroed the effective first moment in time. After applying phase encoding gradients, the magnetic resonance signal was received and an image was reconstructed.

The reconstruction technique of the parent application had certain drawbacks relative to the present improvement. The R.F. characteristics of the parent application imaging sequence limited data collection to one echo signal measurement per heart beat. The imaging sequence duration contributed to a degradation in resolution and accuracy in rapidly accelerating flows and an increase in larger R.F. dosages and heating. Further, artifacts attributable to transverse magnetization arising from the spin-echo refocusing pulse were commonly removed by acquiring a second data set with a phase-inverted refocusing pulse. The collection and combining of two data sets doubles the acquistion time, undesirable from patient consideration.

The present invention contemplates a technique which overcomes the above referenced problems and others to map even high velocity and non-constant blood flows.

SUMMARY OF THE INVENTION

In accordance with one aspect of the present invention, a method of magnetic resonance imaging provided. A resonance excitation pulse is applied in a region of interest. Slice selection and read gradient pulse sequences are applied. At least one of the sequences includes a sequence of complementary gradient pulses of a like product of amplitude and duration in a period between the excitation pulse and receipt of a resultant resonance field echo signal and of opposite polarity such that an effective first moment in time is substantially zero. The resultant resonance field echo signal is monitored.

In accordance with another aspect of the present invention, a method of magnetic resonance spectroscopy is provided. A resonance excitation pulse is applied. A slice selection gradient sequence, including a plurality of slice selection gradient pulses at least some of which are of opposite polarity, is applied. A read gradient pulse sequence, including a plurality of read gradient pulses, at least some of which are of opposite polarity, is applied. Resonance field echo signals are received. The steps of exciting resonance and applying slice selection and read gradient pulse sequences are repeated with at least one of the slice selection and read gradient pulses altered, e.g. time shifted, amplitude scaled, or time scaled, relative to the first slice selection and read gradient pulse sequences. Additional resonance signals from the altered pulse sequences are received. The zeroth moment of altered and unaltered read and slice select gradient pulse sequences is zero.

In accordance with another aspect of the present invention, first and second images are generated. For example, one image may be produced with the above described unaltered sequence and a second image may be produced from the altered sequence. The images each have real and imaginary components. The components have values for each image pixel that each includes a phase term. A phase map representing the velocity for each pixel is calculated from the difference between the phases of the corresponding pixels the first and second images.

In accordance with yet another aspect of the present invention, a magnetic resonance apparatus is provided. Magnets provide a substantially uniform main magnetic field. A resonance excitation control means causes an R.F. coil to apply resonance excitation pulses. Gradient coils and controls are arranged to apply read and slice select gradient sequences selectively across the main magnetic field such that field echoes are caused. A receiving means is connected with the R.F. coil to receive magnetic resonance field echo signals therefrom which are conveyed to an image reconstructing means for reconstructing a representation of an image of the selected slice. A first memory stores a representation of a first image generated with read and slice select gradient sequences that are configured to cause a substantially zero effective first moment in time. A second memory stores a representation of a second image of the same slice generated with at least one of the read and slice select gradient sequences altered to phase encode flow velocities. A calculation means calculates a phase map pixel by pixel from real and imaginary components of the first and second image representations to provide a velocity phase map of the phase difference between the first and second images.

One advantage of the present invention is that it successfully phase maps high flow velocities.

Another advantage resides in the mapping of flows which include turbulence, heat variation, and other non-constant flow components.

Another advantage of the present invention is that it achieves high intraluminal signal intensity.

The present invention is further advantageous in that the imaging sequence is sufficiently short that multiple sequences can be applied during each cardiac cycle. The shorter pulse sequence enables more rapid imaging and improved imaging of rapidly accelerating flows. The use of repeated imaging sequences during a single cardiac cycle enhances contrast between static and flowing materials.

A further advantage resides in reducing R.F. dosage, associated tissue heating, and R.F. power consumption by eliminating broadband inversion pulses.

Still further advantages of the present invention will become apparent upon reading and understanding the following detailed description of the preferred embodiment.

BRIEF DESCRIPTION OF THE DRAWINGS

The invention may take form in various steps and arrangements of steps or in various components and arrangements of components. The drawings are only for purposes of illustrating a preferred embodiment and are not to be construed as limiting it.

DETAILED DESCRIPTION OF THE PREFERRED EMBODIMENT

Figure 1:
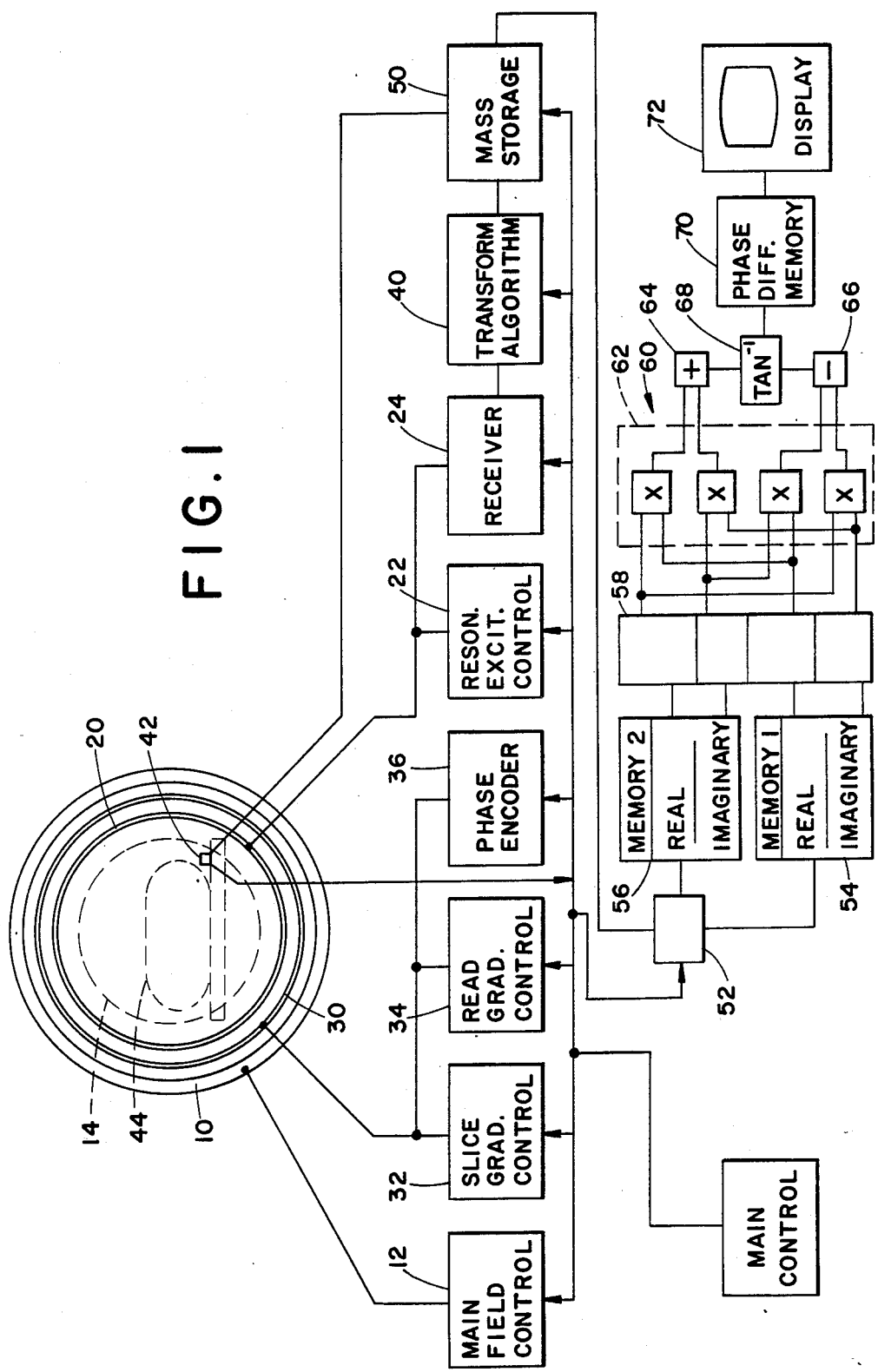
FIG. 1 is a diagrammatic illustration of a magnetic resonance apparatus in accordance with the present invention.

With reference to FIG. 1, a magnetic resonance imaging apparatus includes a plurality of magnetics 10 and a control circuit 12 therefore that generate a substantially uniform magnetic field linearly through an image region (14). A radio frequency (R.F.) coil 20 is connected with a resonance excitation control circuit or means 22 which selectively causes the R.F. coil to transmit a resonance excitation pulse, such as a 90 degree pulse. A radio frequency receiver 24 receives radio frequency resonance signal components generated by resonating nuclei in the image region. Separate transmit and receive coils may be provided or the R.F. coil 20 may function alternately as a transmitter and as a receiving antenna.

A gradient coil 30 includes the appropriate windings for causing gradients across the main magnetic field in the image region at selectable angles and with selectable durations and periodicity. A slice selection gradient control means or circuit 32 selectively applies electrical power to the gradient coil 30 to select a slice or plane in the image region 14 to be phase mapped. Commonly, the slice is selected by applying a linear field gradient across the image region and applying a narrow band excitation pulse to excite spins over a limited range of resonance frequencies. A read gradient control 34 selectively applies a read gradient across the image region. A phase encoder or means 36 selectively adjusts the gradients so as to cause a phase shift which varies with spatial position such that the resonance signal is spatially encoded.

A transform means 40 transforms or maps discretely sampled values of the received resonance signal from a phase domain to a spatial domain. In the preferred embodiment, a fast Fourier transform algorithm transforms or maps the received resonance signal from each field or gradient echo to generate real and imaginary components of a corresponding view in the spatial domain.

A cardiac monitoring means 42 monitors the cardiac cycle of an imaged patient 44. The slice select and read gradient control means are triggered by the cardiac monitoring means at a preselected phase in the cardiac cycle such that views in a single cardiac phase are generated. Optionally, a mass storage means 50 may store the real and imaginary components of views from different phases of the cardiac cycle in conjunction with the phase of the cardiac cycle in which the view was generated. The phase of the cardiac cycle may be calculated from the generated view data or be determined by the cardiac monitor.

A switching or selection means 52 channels to a first memory 54 separate real components $A \cos \alpha$ and imaginary components $A \sin \alpha$ of views of the same phase in the cardiac cycle. The views are summed pixel by pixel, in the first memory to produce a first image representation in which the phase is substantially independent of flow velocity. Real components $B \cos \beta$ and imaginary components $B \sin \beta$ of views or resonance data of the same phase in the cardiac cycle which are encoded with information on the moving portions of the object as discussed above are channelled by the switch means 52 into a second memory 56. Optionally, images at the other phases of the cardiac cycle may be generated if views from several phases of the cardiac cycle are stored in the mass memory means 50.

A threshold means 58 compares the magnitude of the value stored at each pixel in the real and imaginary portions of the first and second memories to determine whether the stored value exceeds a preselected threshold level. If the threshold level is not exceeded, the data values are discarded. Values above the threshold level are utilized by a phase difference determining means 60 to determine the phase difference $\alpha - \beta$ which, of course, varies with the flow.

The phase difference determining means 60 in the preferred embodiment implements the equations:

$$AB\cos(\alpha - \beta) = A\cos\alpha B\cos\beta + A\sin\alpha B\sin\beta \quad (1a)$$

$$AB\sin(\alpha - \beta) = A\sin\alpha B\cos\beta + A\cos\alpha B\sin\beta \quad (1b)$$

To implement these equations, the phase difference determining means includes a cross multiplying means 62 for multiplying real and imaginary values from corresponding pixels of the first and second memories 54, 56. An adding means 64 adds the real component product and the imaginary component product from the multiplying means. A subtracting means 66 subtractively combines the products of real and imaginary component values from corresponding pixels of the first and second memories. An arctangent means 68 ascertains the phase difference, $\alpha - \beta$ from the sine and cosine terms determined by the addition and subtraction means. The calculated phase differences are stored in a difference phase map memory 70 to provide a velocity phase difference map.

A video monitor 72 or other display means converts the values from the phase difference phase map in the difference memory 70 into a man-readable display, such as a video image in which pixel intensity varies with phase shift, hence, velocity. Optionally, the display means may produce other displays from the images, phase maps, and functions thereof.

Figure 2:
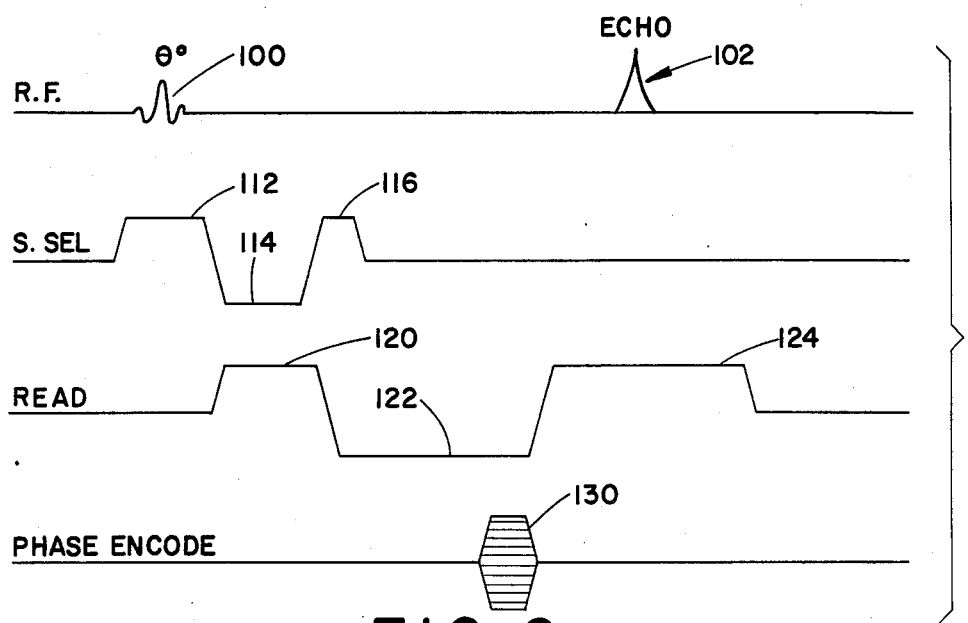
FIG. 2 is a diagrammatic illustration of a 2DFT imaging sequence for flow imaging incorporating an even-echo rephasing using by gradient or field echoes only.

FIG. 2 sets forth the preferred imaging sequence or actuation sequence for the control circuits of FIG. 1. By way of background, in a conventional Carr-Purcell imaging sequence, a 90 degree excitation pulse is followed by two 180 degree inversion pulses which, in turn, are followed by the collection of resonance data. In the present invention, a 90 degree or other excitation pulse 100 is followed by collection of gradient echo or field echo data at 102. The elimination of the inversion pulses from the Carr-Purcell technique reduces the imaging time and permits faster flows and motion to be phase mapped.

Unlike the Carr-Purcell imaging sequence which perforce rephases the moving magnetizaton, the gradient echo sequence does not. In the present invention, magnetization from moving material is rephased by even-echo rephasing of the slice select and the read gradients. More specifically, a slice select gradient pulse sequence includes a pulse 112 of a first polarity which is applied during the application of the excitation pulse 100, a complementary pulse 114 of a second polarity, and a third pulse 116 of the first polarity. The three pulses are preferably of identical amplitudes, with durations such that pulse 116 is of half the duration of pulse 114 and approximately matches that section of pulse 112 occuring after the center of the excitation pulse 100. The magnitudes and durations of the pulses contained in the slice-selection gradient sequence are selected such that the magnetization of material moving perpendicular to the slice plane is rephased.

Analogously, the even-echo rephasing technique is applied to tailor the read gradient pulse-sequence to achieve rephasing of magnetization moving parallel to the read axis. In particular, a read gradient pulse 120 is followed by a pulse 122 of a second polarity and a third pulse 124 of the first polarity, applied contemporaneously with the monitored field echo data 102. Pulses 120, 122, 124 are preferably of identical amplitudes, with durations such that pulse 120 is of half the duration of pulse 122 and approximately matches that section of pulse 124 occurring before the center of the field echo 102. In like manner to the slice selection sequence above, the magnitudes and durations of the pulses contained in the read gradient sequence are selected such that the magnetization of material moving parallel to the read axis is rephased. Pulses 120, 124 may be applied contemporaneously with pulses 112, 114 and a phase encode pulse 130 if required, but this is not a requirement of the invention. During the phase encoding pulse, one of a selected plurality of phases are encoded.

Figure 3:
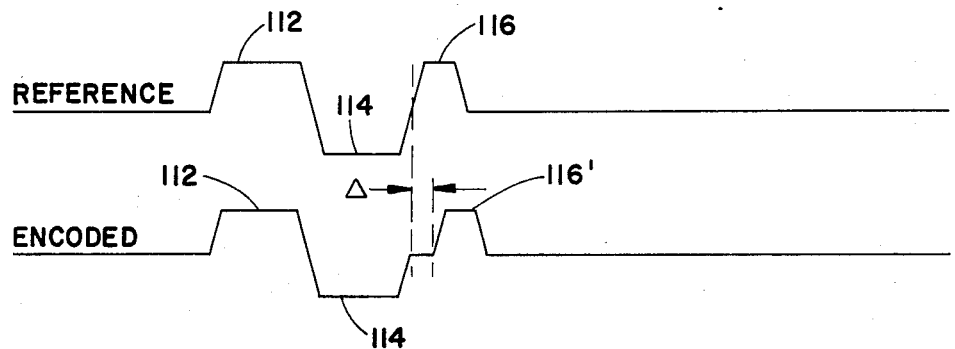
FIG. 3 is a diagrammatic illustration of slice selection gradient sequence for flow encoding by gradient pulse time shifting.
Figure 4:
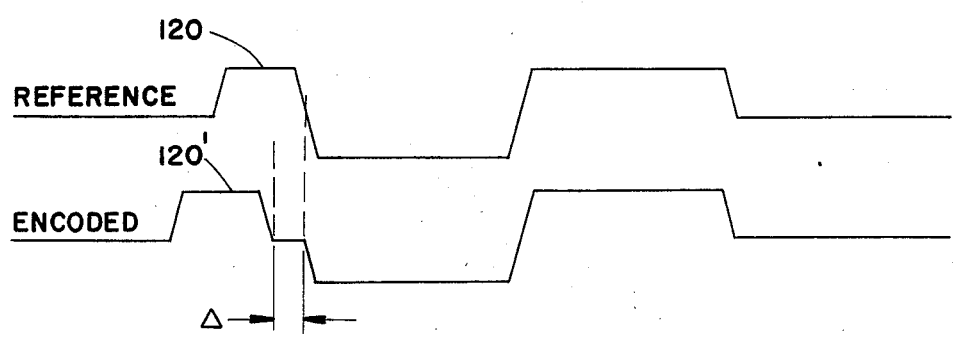
FIG. 4 is an illustration of a read gradient sequence for in-plane flow encoding by gradient pulse time shifting.

With reference to FIGS. 3 and 4, the gradient pulses in the direction of the flow or flow component which is to be phase mapped is shifted to encode flow into the gradient echo. If only the slice selection gradient is shifted (FIG. 3), then the component of flow in the slice selection direction is measured. If only the read gradient is shifted (FIG. 4), then the flow component in the read direction is measured. If both the slice selection gradient and read gradient are shifted, then the flow component oblique to the slice selection and read directions is measured.

If the flow is oblique to either direction, shifting either pulse will reveal flow velocities, but only the absolute flow multiplied by its direction cosine. The oblique angle obtained by shifting both pulses is defined by the relative phase sensitivity of the two gradients. For example, shifts causing twice the phase sensitivity to flow in the read direction than in the slice selection direction will be most sensitive to flow angled 26 degrees (an arctangent of 0.5) from the read axis and be insensitive to flow perpendicular to this direction.

Figure 5:
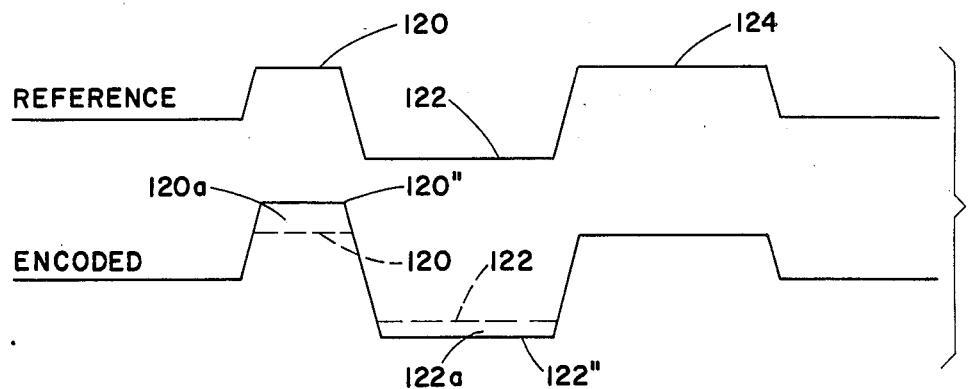
FIG. 5 illustrates the read gradient sequence with flow encoding pulses amplitude scaled.

In the preferred embodiment, the flow encoding is achieved by shifting the first read gradient pulse 120 or the last slice select gradient pulse 116 in time. Specifically, the last slice selection gradient pulse 116 is time shifted or delayed by $\Delta$ to become a time shifted slice selection gradient pulse 116'. Analogously, the first read gradient pulse 120 is time shifted or advanced by $\Delta$ to become a time shifted read gradient pulse 120'. Optionally, the gradient pulse may be amplitude or time-scaled, such that the zeroth moment between the center of the excitation pulse 100 and the field echo data 102 remains at zero but the first moment alters. For example, with reference to FIG. 5, the read gradient pulse 120 can be increased in amplitude to 120" and the amplitude of pulse 122 can be lowered to 122". The increase in the area 120a of the first polarity portion of the pulse sequence and the increase in the area 122a of the second polarity portion of the pulse sequence are equal such that the zeroth moment remains zero. The gradient pulses 114 and 116 of the slice selection gradient sequence may be amplitude scaled analogously.

Figure 6:
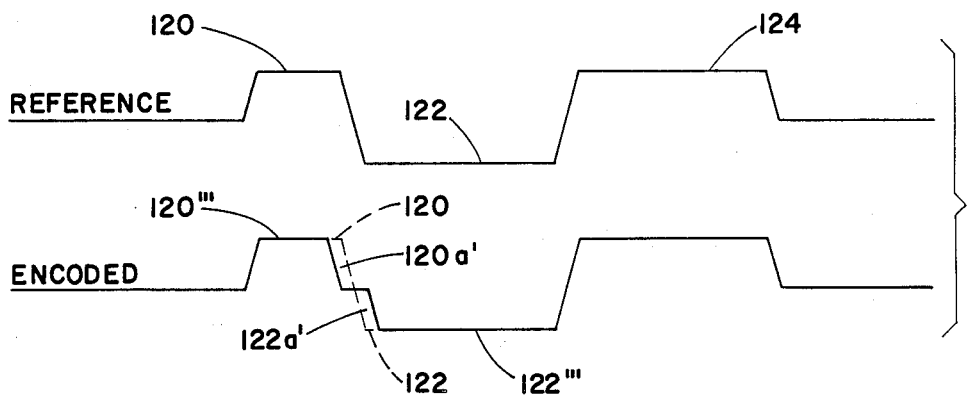
FIG. 6 illustrates the read gradient sequence with flow encoding pulses time scaled; and, FIG. 7 illustrates a symmetric gradient echo sequence for even echo rephasing in which two gradient echoes are locally antisymmetric.

With reference to FIG. 6, the read gradient pulses 120 and 122 can be shortened equally to pulses 120''' and 122'''. The decrease in area 120a' and 122a' are equal. such that the first and second polarity portions of the pulse sequence between the excitation pulse 100 and the echo 102 remain equal. That is, the zeroth moment remains zero although the first moment changes. Optionally, pulses 122 and 124 may be time sealed in a like manner. The gradient pulses 114 and 116 or pulses 112 and 114 of the slice selection gradient sequence may be time scaled analogously.

The imaging sequence is repeated several times during the course of each cardiac cycle which enables several different images at different points or phases in the cardiac cycle to be collected concurrently. One limiting factor is the relaxation state of the protons or hydrogen atoms to be imaged. Repeated irradiation of the same spins, by pulses of a flip angle $\theta$ at repeat times Tr leads to a steady-state attenuation of the signal S:

$$S \propto \sin \theta \frac{\exp(-Tr/Tl) - 1}{\exp(-Tr/Tl)\cos \theta - 1} \quad (2)$$

where T1 is the longitudinal relaxation time of the signals from the tissue remaining in the slice between repetitions of the sequence are then attenuated by rapid pulsing. Blood and any other tissue which moves into the image plane from outside does not experience any such saturation because it is not affected by the slice selection pulses. Accordingly, the signal from tissues moving into the imaging plane is not attenuated in this manner. The signal from material moving into the plane varies as sin $\theta$. Hence, the multiple repetition of the sequence allows measurements of the blood flow velocity at various points during the cardiac cycle. If the relaxation factor in Equation (2), i.e., all the terms except the sine term, is significantly less than unity, the reconstructed images and phase maps show contrast enhancement between flowing and stationary material. This occurs primarily when the Ernst angle is exceeded, i.e., when $\cos \theta$ is less than $\exp(-Tr/T1)$ and when the repeat time Tr is less than the longitudinal relaxation time T1. In practice, gradient pulsing limitations tend to limit the repeat time Tr to a minimum of about 50 ms. It might be noted that the slice definition of the static material may be degraded when the flip angle $\theta$ of the R.F. pulse viries across the slice and the central flip angle is greater than the Ernst angle.

The phase of magnetization subjected to a varying magnetic field gradient may be defined as:

$$\phi(Te) = \phi(0) + \int_0^{Te} G(t) x(t) dt \qquad (3)$$

where $\phi$ (Te) is the phase of magnetization at time Te, G(t) is the gradient strength time t, x(t) is the position of the mignetization packet at time t, and $\gamma$ is the gyromagnetic ratio. The effect on a packet of magnetization undergoing a general motion may be expressed by expanding x(t) as a power series in time differentials of position, as follows:

$$x(t) = x(0) + \sum_{i=1}^{\infty} \frac{t^i}{i!} x^{(i)}(0), \qquad (4)$$

where $x^{(i)}(t)$ is the i'th differential.

Equations 3 and 4 are combined to produce a power series expansion of the phase shift at the center of the echo, $\phi(Te) - \phi(0)$, in terms of the expansion $x^{(i)}(t)$. If the sequence is made symmetrical about its center point, the odd terms in the expansion vanish and the even terms except i=0 remain.

Figure 7:
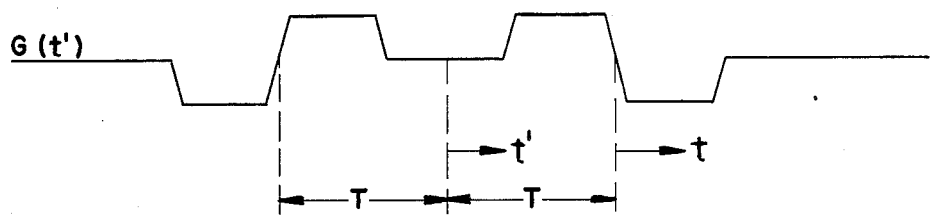

When applied to a symmetrical arrangement of two gradient echoes, each of which is locally antisymmetric as illustrated in FIG. 7, a phase shift due to the general motion may be described as:

$$\phi(Te) - \phi(0) = \sum_{i=1}^{\infty} 2x^{(2i)}(A) \sum_{j=1}^{i} \frac{T^{(2j-1)}}{(2j-1)!(2i-2j+1)!} \int_{-a}^{a} \gamma G(t) t^{(2i-2j+1)} dt. \qquad (5)$$

Note that the expression only contains even differentials of position, $x^{(i)}(A)$ each multiplied by odd powers of the time between the center of the sequence and the center of each individual echo, A. Minimizing this time minimizes the effects of the differentials and leads to improved refocusing.

This time can he minimized using the read and slice select gradient sequences alone to refocus the magnitization. It should also be noted that the omission of a 180° inversion pulse reduces R.F. deposition and artifacting problems.

Shortening the sequence has further advantages when the direction of flow is oblique to the imaging plane. A finite time exists between slice selection, when the magnetization is generated and observation of this magnetization. During this time, obliquily flowing magnetization may move both out of the image plane and to a different pixel. The flowing material then appears at a position in the image which contained no blood vessel or other moving tissue. By reducing the time interval between excitation and observation, this displacement error effect is minimized.

The echo phenomenon produces a signal whose phase is dependent on flow velocity. This velocity dependent phase is incorporated in the slice select and the read gradient profiles as outlined above.

To compensate for the effect of static field inhomogeneity and errors in rephasing, a difference technique is employed. That is, the phase difference is taken between two images, one obtained with velocity dependent phase and the other without. Because the slice select and read gradient pulses are already present, the data for the first and second images may be obtained by time shifting one or more of the gradients by an amount $\Delta$. Excluding terms common to both images, the phase difference between the images may be represented as:

$$\Delta\phi = \int_{t_o}^{t_o + t} \gamma G(t) \{x(t) - x(t + \Delta)\} dt \qquad (6)$$

If the positional displacement of magnetization between the two sequences is constant, $\Delta x$, over the time scale of the gradient pulse, the phase reduces to:

$$\Delta\phi = \Delta x \int_{t_o}^{t_o + t} \gamma G(t) dt. \qquad (7)$$

The average velocity can be uniquely calculated from the phase angle. Specifically, the velocity varies in proportion to the difference in arctangents of the ratio between the real and imaginary values of the first and second image representations. The sensitivity of the measurement is adjusted by changing the time shift parameter $\Delta$. The positional displacement is a product of the average velocity $\bar{v}$ and the time shift parameter, that is:

$$\Delta x = \bar{v} \cdot A \qquad (8)$$

For typical arterial flow measure in the slice select direction, gradient pulses of approximately one kilohertz per centimeter held for 4 milliseconds can code velocities up to one meter per second when time shifted by 1.25 milliseconds. For flow in the read direction, the read gradients are shifted analogously. Concurrent encoding in both the read and slice select directions may be achieved analogously or shifting or scaling the amplitudes of both gradients.

The invention has been described with reference to the preferred embodiment. Obviously, modifications and alterations will occur to others upon reading and understanding the preceding detailed description of the preferred embodiment. It is intended that the invention be construed as including all such alterations and modifications in so far as they come within the scope of the appended claims or the equivalents thereof.

Having thus described the preferred emhodiment, the invention is now claimed to be:

1. A method of magnetic resonance imaging comprising:
   (a) applying a resonance excitation pulse;
   (b) applying a slice selection gradient pulse sequence;
   (c) applying a read gradient pulse sequence;
   (d) applying a phase encode gradient;
   (e) at least one of the slice selection and read gradient pulse sequences including complementary pulses of a like product of duration and amplitude between the resonance excitation pulse and a resonance field echo and of opposite polarity such that the effective first moment in time is substantially zero to cause the resonance field echo;
   (f) monitoring the field echo.

2. The method as set forth in claim 1 further including repeating steps (a) through (f) with at least one of the slice select and read gradient sequences being altered such that flow is encoded into the field echo.

3. The method as set forth in claim 2 in which the sequence is altered by time shifting a pulse of the altered sequence.

4. The method as set forth in claim 2 further including transforming the monitored field echoes from the unaltered and altered sequences into first and second image representations whose pixels have phase components that vary with encoded flow.

5. The method as set forth in claim 4 further including the step of deriving a phase map whose pixel values vary with a difference between the phase components of the first and second image representations.

6. A method of magnetic resonance imaging of moving substances, the method comprising:
   (a) applying a resonance excitation pulse;
   (b) applying a plurality of slice selection gradient pulses of opposite polarity;
   (c) applying a read gradient pulse sequence including a plurality of read gradient pulses of opposite polarity, one of the read gradient pulses being applied during collection of resonance echo signals from a resonance echo;
   (d) applying a phase encode gradient between application of the resonance excitation pulse and collection of the resonance echo signals; and,
   (e) repeating steps (a) through (d) with at least one of the slice selection gradient pulses and read gradient pulses altered such that altered gradient echo resonance signals are collected.

7. The method as set forth in claim 6 wherein one of the slice selection gradient pulses is applied concurrently with the resonance excitation pulse.

8. The method as set forth in claim 7 wherein at least one of the read gradient pulses are applied concurrently with at least one of the slice selections gradient pulses.

9. The method as set forth in claim 6 wherein during a period between the excitation pulse and the resonance echo the slice selection gradient sequence includes pulses of one polarity that are of a substantially equal total product of duration and amplitude with pulses of the opposite polarity.

10. The method as set forth in claim 9 wherein a first slice selection gradient pulse of the sequence is applied concurrently with the resonance excitation pulse.

11. The method as set forth in claim 6 wherein during a period between the excitation pulse and the resonance echo the total product of amplitude and duration of read gradient pulses of a first polarity is equal to the total product of amplitude and duration of pulss of a second plurality.

12. The method as set forth in claim 11 wherein a second of the read gradient pulse pair is applied concurrently with the collection of resonance echo signals.

13. The method as set forth in claim 6 wherein the step of altering at least one of the slice selection gradient and read gradient pulses includes amplitude sscaling and pair of opposite polarity pulses such that the area under both pulses changes by the same amount.

14. The method as set forth in claim 6 wherein the step of altering at least one of the slice selection gradient and read gradient pulses includes time shifting the at least one pulse relative to the other pulses in the read and slice selection gradient sequences.

15. The method as set forth in claim 14 further including the steps of transforming the first collected resonance echo signals into a first image and transforming the second collected resonance echo signals into a second image.

16. The method as set forth in claim 15 further including the step of differentially combining phase components of the first and second images to produce a representation in which each pixel has a magnitude indicative of flow velocity.

17. The method as set forth in claim 16 wherein the first and second images each include real and imaginary portions and wherein the differential combining step includes cross multiplying real and imaginary components of the first and second images and combining products of the cross multiplication additively and subtractively to derive values which are proportional to (1) a cosine of the phase difference at each pixel and (2) a sine of the phase difference at each pixel and deriving the phase difference from the sine and cosine values for each pixel to determine pixel values for the image representation.

18. A method of magnetic resonance examination of moving substances, the method comprising;
   (a) acquiring a first image having real and imaginary components with first gradient pulse sequences;
   (b) acquiring a second image having real and imaginary components with second gradient pulse sequences in which at least one pulse is altered relative to the first gradient pulse sequence;
   (c) multiplying the real components of the first and second images, multiplying the imaginary components of the first and second images, and adding the multiplication products;
   (d) multiplying the real component of the first image with the imaginary component of the second image, multiplying the imaginary component of the first image with the real component of the second image, and subtractively combining the products;
   (e) taking an arctangent of the sum of step (c) and the difference of step (d) to produce a phase map whose components vary in accordance with phase difference.

19. A magnetic resonance apparatus for examining moving substances, the apparatus comprising:

a main magnetic field control means for generating a generally uniform magnetic field through an image region; at least one coil for transmitting and receiving radio frequency signals, the coil being disposed adjacent the image region;

a resonance excitation control means for selectively causing the coil to transmit a resonance excitation pulse;

a receiving means for receiving a radio frequency resonance signal received by from the coil;

a gradient coil means for selectively causing magnetic field gradients across the main magnetic field;

a slice selection gradient means for selectively causing the gradient coil means to generate gradient pulse sequences for selecting a slice through the image region to be imaged;

a read gradient control means for selectively causing the gradient coil means to generate a read gradient pulse sequences across the slice;

a phase encoder means for selectively causing the gradient coil means to phase encode resonating nuclei in the selected slice;

a transform means for selectively transforming the resonance signal from the receiving means into an image representation which has real and imaginary values each having a phase component for each of a plurality of pixels;

a first memory means for storing the real and imaginary values of a first image representation which is produced when the slice selection gradient control means and the read gradient control means apply slice selection and read gradient pulse sequences in such a manner that an effective first moment in time in the selected slice is substantially zero;

a second memory means for storing the real and imaginary values of a second image representation which is produced when at least one of the slice selection gradient control means and the read gradient control means flow encodes resonating nuclei in the selected slice by shifting at least one pulse of the respective slice selection and read gradient pulse sequences;

a phase difference determining means for determining a phase map whose intensity values vary with phase difference, the phase difference determining means being operatively connected with the first and second memory means for receiving phase components of the first and second image real and imaginary values and determining a phase map whose pixel valves vary with phase difference between phase components of corresponding pixels.

* * * * *